US006064267A

United States Patent [19]
Lewyn

[11] Patent Number: 6,064,267
[45] Date of Patent: May 16, 2000

[54] CURRENT MIRROR UTILIZING AMPLIFIER TO MATCH OPERATING VOLTAGES OF INPUT AND OUTPUT TRANSCONDUCTANCE DEVICES

[75] Inventor: Lanny Lewyn, Laguna Beach, Calif.

[73] Assignee: GlobeSpan, Inc., Red Bank, N.J.

[21] Appl. No.: 09/167,093

[22] Filed: Oct. 5, 1998

[51] Int. Cl.$^7$ .................... H03F 3/04

[52] U.S. Cl. .................... 330/288; 330/257; 323/315

[58] Field of Search .................... 330/257, 288; 323/315, 316

[56] References Cited

U.S. PATENT DOCUMENTS

| | | | |
|---|---|---|---|
| 4,583,037 | 4/1986 | Souch | 323/315 |
| 5,039,954 | 8/1991 | Bult et al. | 330/277 |
| 5,212,458 | 5/1993 | Fitzpatrick et al. | 330/288 |
| 5,568,045 | 10/1996 | Koazechi | 323/314 |
| 5,612,614 | 3/1997 | Barrett, Jr. et al. | 323/316 |
| 5,666,046 | 9/1997 | Mietus | 323/313 |
| 5,694,033 | 12/1997 | Wei et al. | 323/315 |

FOREIGN PATENT DOCUMENTS

| | | | |
|---|---|---|---|
| 649218A1 | 4/1995 | European Pat. Off. | H03F 3/45 |

OTHER PUBLICATIONS

Johns, D. et al., Analog Integrate Circuit Design, John Wiley & Sons, Inc., pp. 256–303, 1997.

Ramirez–Angulo, J., "Current Mirrors with Low Input and Low Output Voltage Requirements," Proceedings on the Midwest Symposium on Circuits and Systems, US New York, IEEE, Symp. 37, pp. 107–110, Mar. 8, 1994.

*Primary Examiner*—Benny Lee
*Assistant Examiner*—Henry Choe
*Attorney, Agent, or Firm*—Pillsbury Madison & Sutro LLP

[57] ABSTRACT

A current mirror utilizes an operational amplifier to provide linear operation over a wide output voltage range. The current mirror includes input transconductance, output transconductance, input cascode and output cascode devices. The operational amplifier has two inputs, one of which is coupled to a node between the output transistors, and the other of which is coupled to a node between the input transistors. The output of the amplifier is used to drive the control terminal of the input cascode device so that the operating voltage of the input transconductance device will be approximately equal to that of the output transconductance device.

43 Claims, 6 Drawing Sheets

CURRENT MIRROR UTILIZING AMPLIFIER TO MATCH OPERATING VOLTAGES OF INPUT AND OUTPUT TRANSCONDUCTANCE DEVICES

BACKGROUND OF THE INVENTION

1. Field of the Invention

This invention relates to integrated circuit (IC) current mirrors, and more particularly to current mirrors, configured from metal oxide semiconductor field effect transistors (MOSFETs), which include circuitry to maintain the drain voltage on the input transconductance transistor approximately equal to the drain voltage on the output transconductance transistor to provide low current gain error and wide output voltage dynamic range.

2. Description of the Prior Art

Current mirrors are used in ICs to provide an output current which is proportional to an input current. Current mirrors are particularly useful in operational transconductance amplifiers (OTAs). Some complementary metal oxide semiconductor (CMOS) OTAs couple an NMOS current mirror with a PMOS current mirror to provide the output stage of the OTA.

Referring to FIG. 1, a simple (NMOS) current mirror consists of an input transconductance device, FET N1, and an output transconductance device, FET N2. The sources of both transistors are connected to a reference potential, VSS. The drains of both transistors receive current from a common supply voltage (not shown).

The gates of transistors N1 and N2 are connected together and to the drain terminal of the input transconductance device N1. Because no current can flow through the gate terminal of the input transconductance device, all of the input current I_IN flows through the input transconductance device drain terminal. The gate terminal voltage of the input transconductance device will rise to the potential needed for the input transconductance device N1 to conduct the input current. Since the gate of the output transconductance device N2 is connected to the same point as the gate of the input transconductance device, the gate-source voltage $V_{GS}$ of both transistors will be the same, and will vary as a function of the input current I_IN. Both the input and output transconductance devices are operated in the saturation region so that the drain current will not significantly vary as a function of the drain supply voltage. If the transistors are matched with respect to threshold voltages, $V_T$, and width/length (W/L) ratios, the output current I_OUT will "mirror" the input current I_IN.

When the output of a simple current mirror is used as the output of an operational amplifier, the drain resistance of the output transconductance device is in parallel with the load resistance. The finite resistance of the output transconductance device tends to limit the voltage gain of the amplifier ($Av \approx g_m R_L$).

To increase the output resistance of prior art current mirrors, a cascode device is often used in the output stage. FIG. 2 shows the placement of FET N3 as an output cascode device. The gate of the output cascode device N3 is coupled to the gate and drain terminals of a (diode-connected) input cascode device N4, which receives the current input to the mirror. Transistor N3 serves to reduce the voltage swing at the drain of the output transconductance device N2 in relation to the voltage swing at the output of the current mirror. Because the gate voltage of transistors N3 and N4 are equal, the source voltages undergo similar, but not equal variations. When the voltage swing at the drain of the output transconductance device N2 is reduced, the output current consumed by the output resistance of the transconductance device is reduced proportionately. Accordingly, the output current more nearly matches the input current, as compared to the simple current mirror configuration.

Adding an output cascode device to reduce by more than a factor of 10 the drain voltage swing of the output transconductance device significantly reduces the small signal current consumed by the impedance of the output transconductance device. This increases the input to output current matching of the current mirror. The resulting voltage gain of an OTA using such mirrors is increased over that possible using simple mirrors by a substantial factor. That factor is proportional to the reduction in output transconductance device voltage swing compared to the cascode device drain output voltage swing at the signal frequency in question.

The prior art current mirror of FIG. 3 uses an operational amplifier AMP_A to control the gate voltage of the output cascode device N3. The non-inverting input of the amplifier is coupled to a reference potential VREF1. The inverting input of the amplifier is coupled to the node connecting the source terminal of the output cascode device N3 and the drain terminal of the output transconductance device N2. The operational amplifier and transistor N3 provide a feedback loop to control the voltage at the drain of the output transconductance device N2. A decrease in the output voltage V_OUT results in increased gate potential to transistor N3 which in turn reduces the decrease in the voltage at the drain of transistor N2.

In the current mirrors of FIGS. 2 and 3, a certain minimum voltage drop is required across the cascode output stage to keep it in the high-impedance saturated region of operation. In addition, the source voltage of the cascode output stage must be high enough to maintain the output transconductance device N2 in saturation. Practical minimums for the drain to source voltage drop in CMOS wideband amplifiers have been in the range of 0.3 to 0.5 V. Thus, the output stage of an OTA, using complementary N and P cascode mirrors, consumes a total voltage drop of 4 times 0.3 to 0.5 V, or 1.2 to 2 V. If the voltage supply is 3V, only 1 to 1.8 V is left for output voltage swing. This situation presents a serious problem as supply voltages in CMOS ICs continue to decrease (for example, from 3V to 2.5 V) to accommodate decreasing line-widths (for example from 0.35 to 0.25 $\mu$m). As line widths decrease, the maximum drain to source voltage drop of FETs has typically been correspondingly decreased in order to avoid hot electron degradation and excess drain current loss due to impact ionization.

In the prior art circuit of FIG. 4, a diode connected transistor N5 is used to bias the source voltage of cascode transistors N4 and N3 such that the drain voltage of the transconductance devices N1 and N2 will be just above the voltage required to maintain the transconductance devices in saturation. The object is to lower the drain to source voltage drop for the output transconductance device to make more of the supply voltage available for output voltage swing. However, such circuit arrangement has a tendency toward non-linear operation. Because the output transconductance device N2 is biased close to the edge of saturation, a drop in the output voltage V_OUT which is sufficient to cause the output cascode device N3 to drop out of saturation will in turn cause the output transconductance device N2 to drop out of saturation. Thus, the input transconductance device N1 may be operating in saturation, while the output transconductance device N2 is operating below saturation, resulting in non-linear operation.

Combining the techniques of the FIGS. 3 and 4 circuits does not overcome the deficiencies of conventional current mirrors. For example, utilizing an operational amplifier as shown in FIG. 3 to stabilize the source voltage of the output cascode device N3 of FIG. 4 provides only a small improvement in output voltage swing. This is because the key to the FIG. 4 circuit is to place the source voltage of the output cascode device N3 close to the voltage corresponding to the edge of saturation for the output transconductance device N2. Therefore, output voltage swings slightly larger than those required to keep the output cascode device N3 in saturation, in turn cause the output transconductance device N2 to drop out of saturation, thereby not overcoming the resultant potential for non-linear operation.

Using the wide-swing biasing technique of FIG. 4 to place the drain voltage of the transconductance device N2 close to the edge of saturation in the current mirror of FIG. 3 increases transient response problems known to exist in the current mirror of FIG. 3. When a dip in the output voltage V_OUT causes the cascode device N3 (of FIG. 3) to drop out of saturation, a large gate control voltage is generated by the operational amplifier. The time required for removal of the large gate control voltage induces output transients when the output cascode device returns to the saturation mode of operation.

SUMMARY OF THE INVENTION

Accordingly, it is an object of the present invention to provide a current mirror which operates linearly over a wide output voltage range.

Another object of the invention is to increase the current mirror supply voltage without causing the devices from which the current mirror is configured to suffer from hot electron degradation or excess drain current loss due to impact ionization.

A further object of the invention is improved recovery from large signal output transients in a MOS current mirror.

These and other objects of the invention are provided by a current mirror configuration which utilizes a gain boost operational amplifier in combination with input and output transconductance and cascode transistors. The amplifier has two inputs, the first of which is coupled to the node connecting the drain terminal of the output transconductance device and the source terminal of the output cascode device. The second amplifier input is coupled to the node connecting the drain terminal of the input transconductance device and the source terminal of the input cascode device. The output of the amplifier is used to control the voltage at the gate terminal of the input cascode device.

Unlike prior art current mirrors, the present invention provides a linear relationship between output current and input current even when the output devices are operating below the saturation region. As the voltage falls at the node defined by the drain terminal of the output transconductance device and the source terminal of the output cascode device, the operational amplifier will control the voltage at the gate terminal of the input cascode device so that the voltage at the source of the input cascode device (the drain of the input transconductance device) will be approximately the same as the voltage at the source of the output cascode device (the drain of the output transconductance device). Thus, the drain to source voltage of the input transconductance device tracks the drain to source voltage of the output transconductance device, both above and below saturation. Accordingly, equality of the input and output currents is maintained over a wide range of output voltage swing.

In the preferred embodiment, the source of the output transconductance device is placed at a negative voltage, illustratively −2.5V. The gate terminal of the output cascode device is connected to a source of reference potential, illustratively ground. This allows the current mirror output voltage to swing significantly above and below ground, including below the voltage required to keep the output cascode device in saturation (thereby increasing output swing) without introducing hot electron or impact ionization stress on the output cascode device.

Such circuit recovers well from large output signal transients because only small amounts of boost operational amplifier output changes are required to compensate for changes of like magnitude in the drain voltage of the output transconductance device.

BRIEF DESCRIPTION OF THE DRAWINGS

Aspects of the invention are described with reference to the drawings, in which.

DETAILED DESCRIPTION OF THE INVENTION

Figure 5:
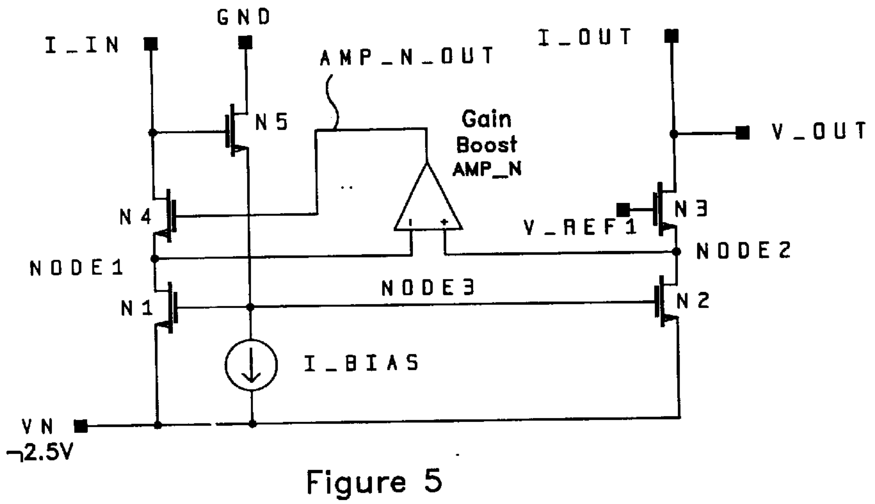
FIG. 5 is a simplified circuit diagram for the current mirror of the present invention.

A N channel transistor version of the current mirror of the present invention, as shown in the circuit diagram of FIG. 5, includes an input transconductance device, transistor N1; an output transconductance device, transistor N2; an output cascode device, transistor N3; and an input cascode device, transistor N4. The source terminals of transistors N1 and N2 are coupled to reference voltage VN, which is illustratively −2.5V. The drain terminal of the input transconductance device N1 is coupled to the source terminal of the input cascode device N4 to define NODE1. The drain terminal of the output transconductance device N2 is coupled to the source terminal of the output cascode device N3 to define NODE2. The drain terminal of the input cascode device N4 is coupled to the current input terminal I_IN, while the drain terminal of the output cascode device N3 is coupled to the current output, I_OUT, terminal which also serves at the voltage output, V_OUT, terminal.

The gate terminals of the input and output transconductance devices N1 and N2 are coupled together to define a third node, NODE3. In FIG. 5, NODE3 is coupled to the current input terminal I_IN via an active device, i.e., transistor N5. The gate of transistor N5 is connected to terminal I_IN, the drain is coupled to a reference voltage, here shown as ground, and the source of transistor N5 is coupled to node NODE3. Transistor N5 is configured as a source follower. Its purpose is to level shift the voltage at the drain of the input cascode device, providing the level-shifted voltage to the gates of transistors N1 and N2. This allows increases in the voltage headroom at the drains of both the input and output transconductance devices N1 and N2. A current bias generator I_BIAS is coupled between NODE3 and VN to help set the proper voltage at NODE3.

A gain boost amplifier (Gain Boost AMP_N) is used to control the gate voltage of the input cascode device N4. The amplifier has two inputs. The inverting input of the amplifier is coupled to NODE1, while the non-inverting input of the amplifier is coupled to NODE2. The amplifier output AMP_N_OUT is coupled to the gate of the input cascode device N4. The amplifier senses the difference between the voltage levels at NODE1 and NODE2, i.e., at the drains of the input and output transconductance devices, N1 and N2, and controls the gate voltage of input cascode device N4 so that the source voltage of device N4, (i.e., the drain voltage of the input transconductance device N1) will be substantially equal to the drain voltage of the output transconductance device N2. Any small difference in the drain voltages between the input and output transconductance devices is the result of the small error voltage of the operational amplifier. Thus, the amplifier causes the drain voltages of the input and output transconductance devices to be substantially the same. The source terminals of the input and output transconductances devices are coupled together (and to VN). Likewise, the gate terminals of the input and output transconductance devices are coupled together (and to the current input I_IN, via the source follower transistor N5). This results in the current mirror of the present invention having nearly equal input and output currents, i.e., low current gain error.

Importantly, the gain boost operational amplifier controls the voltage at the drain of the input transconductance device N1 to track the voltage at the drain of the output transconductance device N2, even if the output cascode and transconductance devices fall below the saturation region of operation. As the output voltage, V_OUT, swings below the voltage required to maintain the output cascode device N3 in saturation, the voltage at the source terminal of the output cascode device will also fall. If the output cascode transistor source voltage (i.e., the output transconductance transistor drain voltage) falls sufficiently, the output transconductance transistor N2 will also drop out of saturation. Nevertheless, the gain boost operational amplifier will produce a matching drop in the voltage at the drain of the input transconductance device N1. Thus, approximate equality of the input and output currents is maintained over a wide range of output voltage swing.

Output voltage swing is also enhanced by maintaining the gate of the output cascode device N3 at a fixed reference potential V_REF1. Such reference potential may be ground when the output voltage V_OUT is centered about ground. Output voltage swings beyond ±1V are achievable in this configuration. Output voltages significantly below those sufficient to maintain the output cascode device in saturation do not contribute to undue output transients, gate voltage stress, hot electron or impact ionization stress on the output cascode device if the gate is operated at a constant reference potential.

An increased voltage supply is permitted by the present invention because an increase in supply voltage does not significantly increase the stress on the output cascode device. In the wide-swing prior art circuits, the key feature is placing the cascode source voltage close to the supply voltage. In such prior art circuits, increasing the supply voltage increases the cascode quiescent drain-to-source voltage proportionally with respect to the supply voltage increase. However, such is not the case with respect to the present invention because the gate of the output cascode device is operated at a reference potential near the middle of the output swing.

Figure 6:
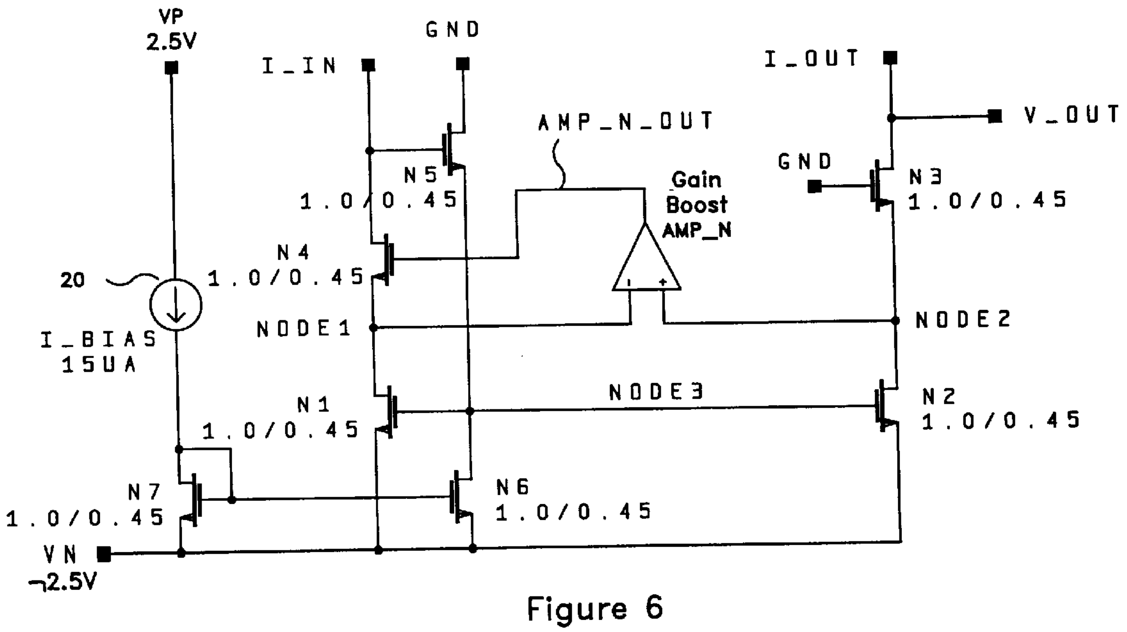
FIG. 6 is a more detailed circuit diagram for the current mirror of the present invention.

FIG. 6 illustrates a more detailed circuit diagram of the current mirror of the present invention. In FIG. 6, the width/length ratios of transistors N1–N5 are identified in microns. The output transconductance and cascode devices N2 and N3 are shown in FIG. 6 as having the same width/length ratios (1.0/0.45) as input transconductance and cascode devices N1 and N4 to provide a unity gain current mirror. If the widths of the channels of the output transconductance and cascode devices N2, N3 are increased by a factor, e.g., 4, and the channel lengths for the mirror transistors N1–N4 remain the same, the gain of the current mirror is increased by the same factor, i.e., 4.

FIG. 6 also illustrates that the current bias generator I_BIAS (of FIG. 5) may be realized by FET N6. The drain of transistor N6 is coupled to NODE3, and the source of transistor N6 is coupled to VN. The gate of transistor N6 is coupled to the drain of diode-connected transistor N7. Transistor N7 is an input bias transistor, having its source coupled to VN and its gate and drain coupled to a current bias generator 20.

Figure 7:
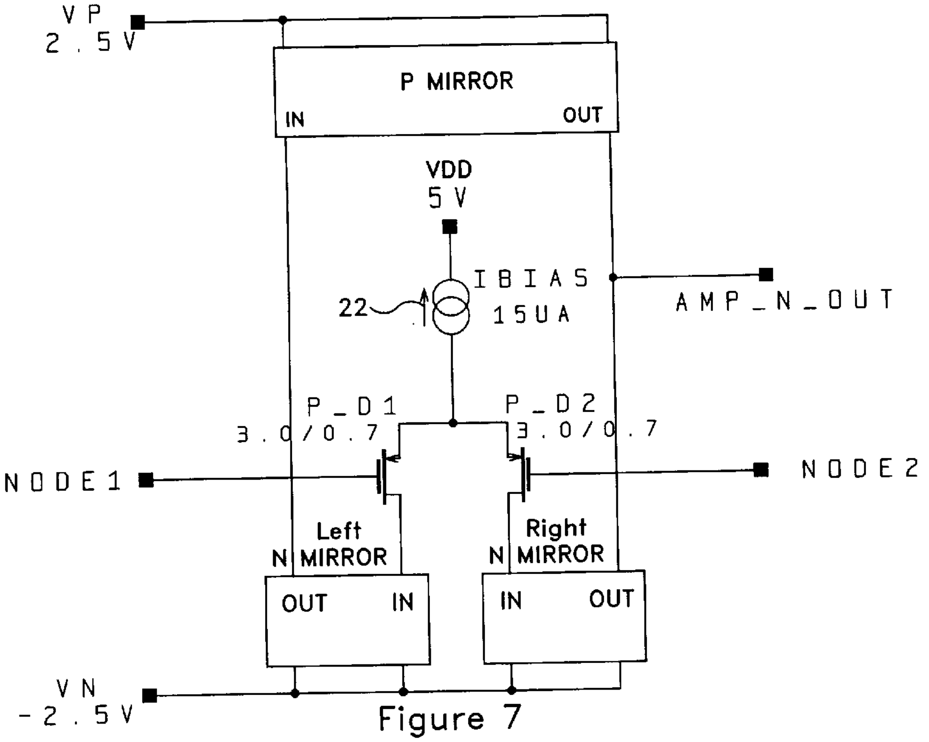
FIG. 7 is a simplified circuit diagram of a gain boost amplifier used in the current mirror of the present invention.

FIG. 7 is a simplified circuit diagram of an amplifier which can be used to implement the gain boost amplifier of FIGS. 5 and 6. The amplifier input terminals (NODE1 and NODE2 of FIGS. 5 and 6) are respectively applied to the gates of differential pair P channel transistors P_D1 and P_D2. The sources of the differential pair transistors are coupled together and to a current bias generator 22. The drains of the differential pair transistors are respectively coupled to the inputs of a left current mirror formed from N channel transistors and a right current mirror also formed from N channel transistors.

The output of the left N channel current mirror is coupled to the input of a current mirror formed from P channel transistors. The output of the right N channel current mirror is coupled to the output of the P channel current mirror to provide the amplifier output AMP_N_OUT, which is applied to the gate of the input cascode device N4 of FIGS. 5 and 6.

The P channel current mirror is coupled to supply voltage VP which is illustratively +2.5V, while the N channel circuit mirrors are each coupled to supply voltage VN which is illustratively −2.5V. With such supply voltages, the supply voltage VDD for the differential pair P channel transistors may be set at +5V.

Figure 1:
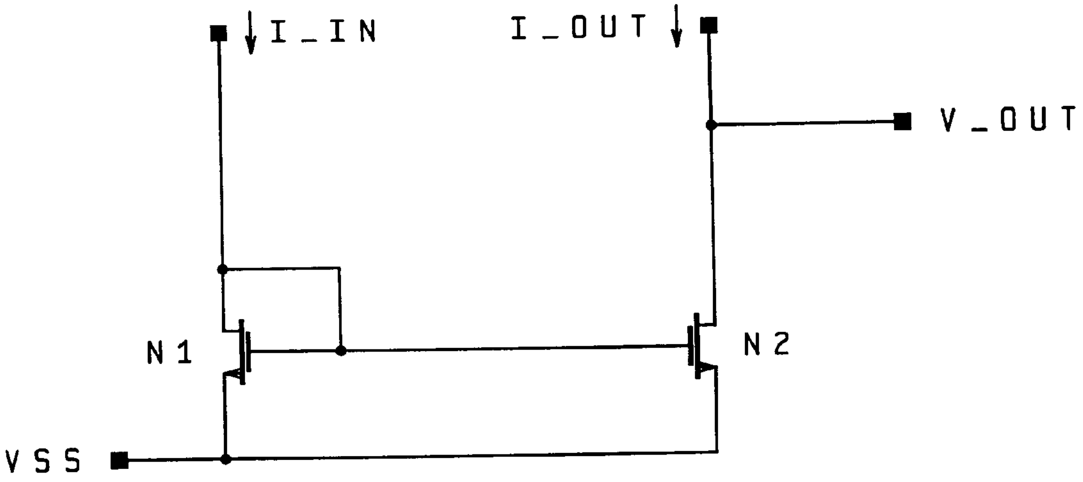
Figure 1 Prior Art
FIG. 1 is a circuit diagram for a simple prior art current mirror.
Figure 2:
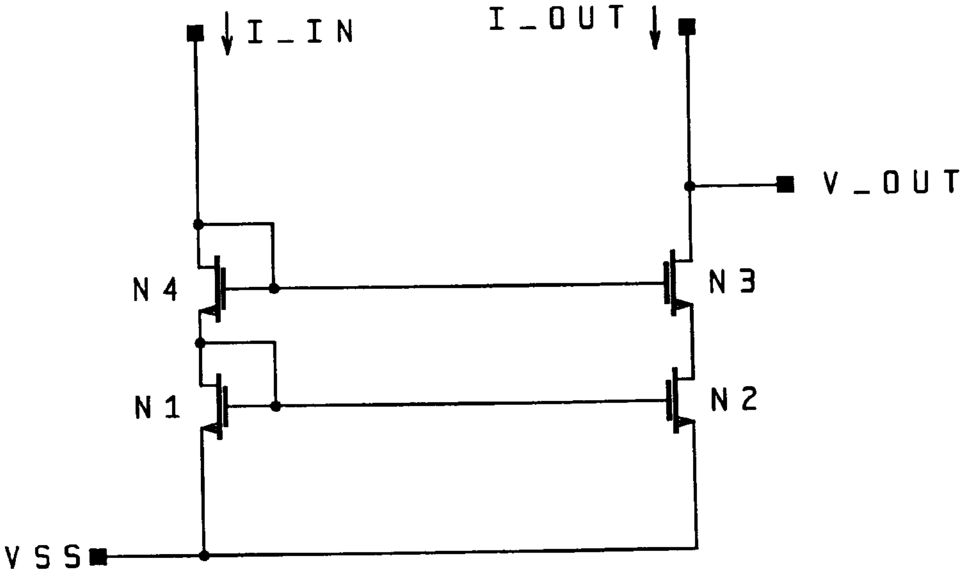
Figure 2 Prior Art
FIG. 2 is a circuit diagram for a prior art current mirror which includes input and output cascode devices.
Figure 3:
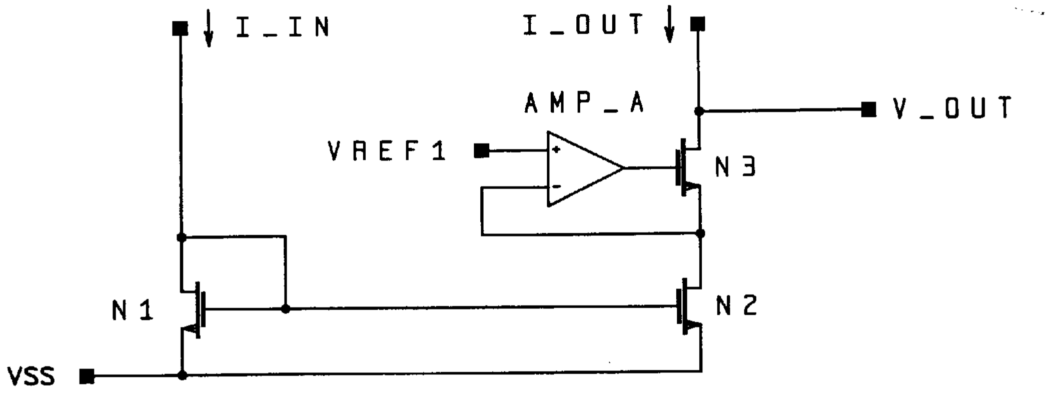
Figure 3 Prior Art
FIG. 3 is a circuit diagram for a prior art current mirror which includes an operational amplifier to control the gate voltage of the output cascode device.
Figure 4:
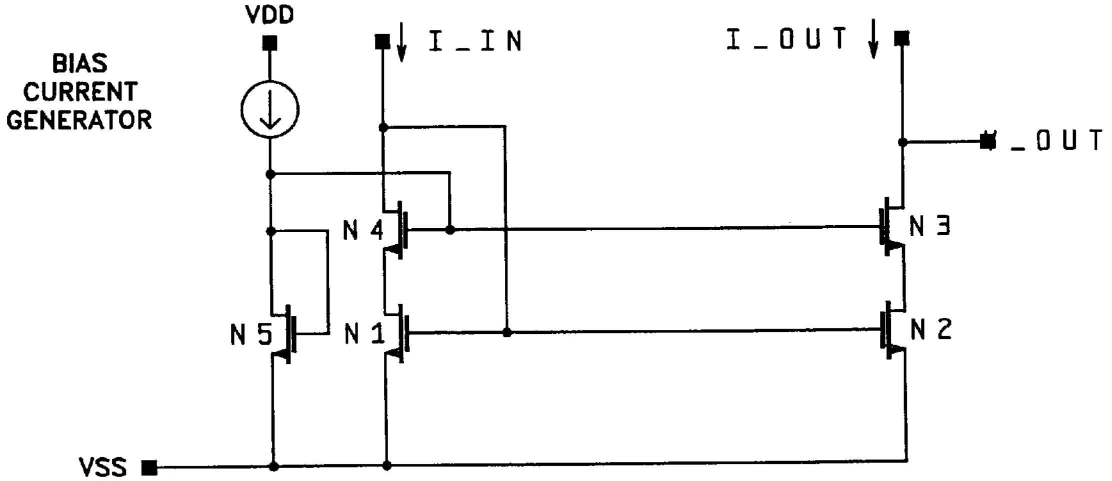
Figure 4 Prior Art
FIG. 4 is a circuit diagram for a prior art current mirror which includes a diode connected transistor to control the gate voltages of the input and output cascode devices.
Figure 8:
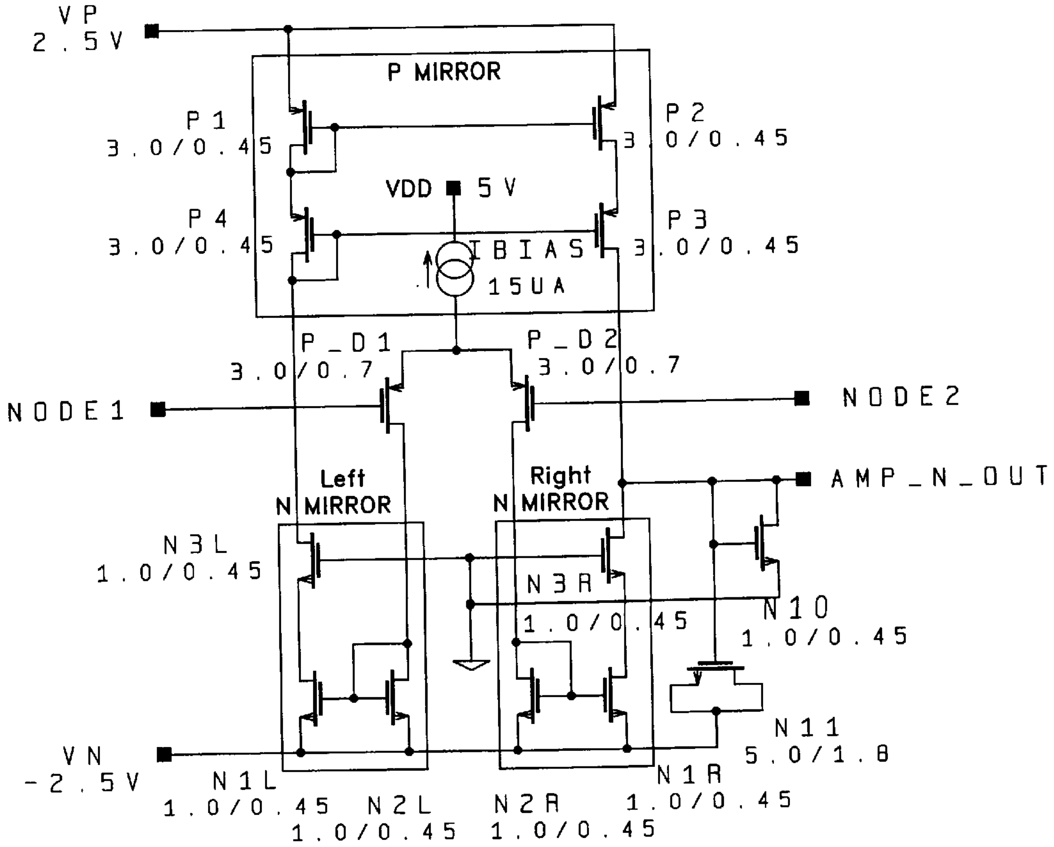
FIG. 8 is a circuit diagram of a gain boost amplifier used in the current mirror of the present invention.

FIG. 8 is a circuit diagram of a gain boost amplifier which may be used for the present invention. The P channel current mirror is configured from input and output transconductance and cascode devices P1–P4 which correspond respectively to P channel versions of transistors N1–N4 of the N channel prior art current mirror of FIG. 2. The N channel current mirrors are configured similarly to the prior art current mirror of FIG. 1, but output cascode devices N3L and N3R are added to increase output impedance.

The gain boost amplifier includes a clamping transistor N10 and a transistor N11 which is used as a compensation capacitor. Transistor N10 serves to prevent the gain boost amplifier output AMP_N_OUT from exceeding the voltage limits of the output cascode device N3R in the right current mirror under unusual operating conditions, such as power supply startup. The capacitor, i.e., transistor N11, is coupled between the output AMP N_OUT and supply voltage VN to provide high frequency stability.

Figure 9:
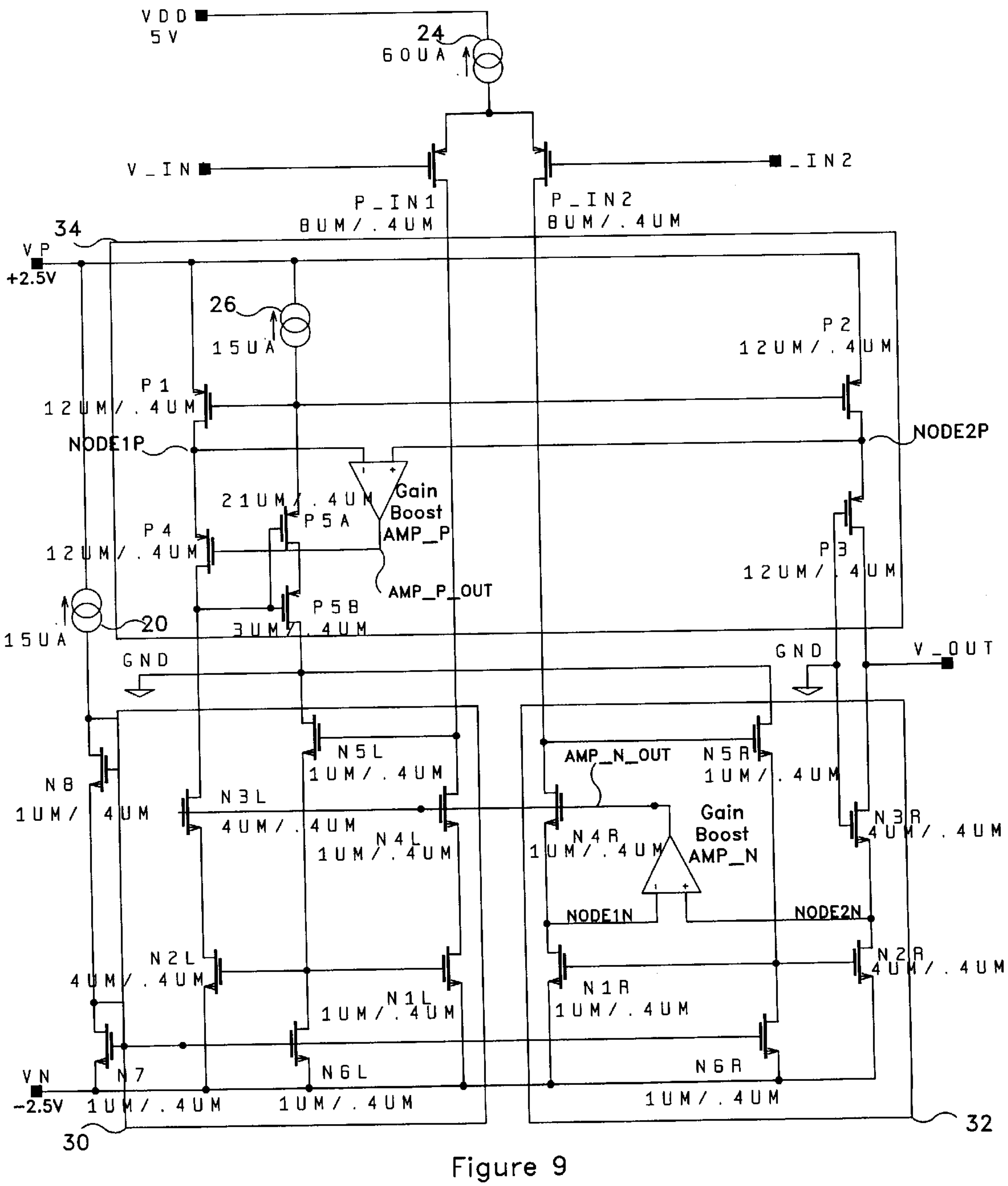
FIG. 9 is a circuit diagram of a CMOS OTA including NMOS and PMOS current mirrors according to the present invention.

FIG. 9 is a schematic diagram of an operational transconductance amplifier (OTA) according to the present invention. The amplifier of FIG. 9 may be represented by a block diagram similar to the gain boost amplifier of FIG. 7. That is, both amplifiers include a differential pair of P channel transistors, a current mirror formed from P channel transistors and two current mirrors formed from N channel transistors.

In FIG. 9, a differential input signal is applied to the gates of differential pair P channel transistors P_IN1 and P_IN2, via input terminals V_IN1 and V_IN2, respectively. The sources of the differential pair transistors are coupled together and to a current bias generator 24. Supply voltage VDD is illustratively 5V.

The drains of input transistors P_IN1 and P_IN2 are coupled to the drains of input cascode transistors N4L, N4R of left and right N channel current mirrors 30, 32, respectively. The right N channel current mirror 32 is constructed identically to the current mirror of FIG. 6, except that the width/length ratios of output transconductance and cascode transistors N2R, N3R are four times larger than the width/length ratios of input transconductance and cascode devices N1R, N4R to provide current mirror 32 with a current gain of 4.

Left current mirror 30 differs from right mirror 32 in that the gate of the input cascode device N4L is driven by the output of the Gain Boost AMP_N of mirror 32, instead of by a gain boost amplifier within mirror 30. Current mirror 30 does not include a gain boost amplifier. The gate of transistor N4L of the left mirror is driven by the output of the Gain Boost AMP_N of the right mirror 32 in order to provide the input transistors P_IN1 and P_IN2 with the same dynamic load.

Further, the gate of transistor N3L of the left mirror 30 is also driven by the output of the AMP_N of the right mirror 32, instead of being grounded as in the right mirror 32. This is done in order to balance the drain voltages of transistors N2L and N1L and maintain the proportionality of the current flowing through transistors N3L and N4L of the left mirror 30. Because the sources of transistors N1L and N2L are coupled to the same point, VN, and their gates are driven by the same signal, the current flowing through the output transistors N2L, N3L will be proportional to the current flowing through the input transistors N1L, N4L. In the left mirror 30 of FIG. 9, the output current will be four times the input current since the W/L ratios of transistor N2L, N3L are four times that of transistors N1L, N4L.

The output of the left mirror 30 is applied to the input of P mirror 34. Current mirror 34 is a P channel version of the current mirror of FIG. 6. Input current (from the left mirror 30) is applied to the drain terminal of input cascode device P4. The source of the input cascode device P4 is coupled to the drain of input transconductance device P1 to define NODE1P. The source of transistor P1 is coupled to source voltage VP, which is illustratively 2.5V. Supply voltage VP is also supplied to the source of output transconductance device P2.

The gates of the input and output transconductance devices P1, P2 are coupled together and to mirror 34 input, via a series-connected source follower pair P5A, P5B. The source of transistor P5A is coupled to the gates of transistors P1, P2 and to the current bias generator 26. The drain of transistor P5A is coupled to the source of transistor P5B, and the drain of transistor P5B is coupled to a reference voltage, ground in this embodiment. The gates of transistors P5A and P5B are coupled to the P current mirror 34 input. Transistors P5A and P5B level shift the voltage at the drain of the input cascode device P4 and provide the level-shifted voltage to the gates of the input and output transconductance devices P1, P2. The drain of the output transconductance device P2 is coupled to the source of the output cascode device P3 to define NODE2P. Output cascode device P3 has its gate coupled to a reference voltage, illustratively ground, and its drain coupled to the drain of the output cascode device N3R of the right N channel current mirror 32 to provide the amplifier output V_OUT.

NODE1P and NODE2P are coupled respectively to the inverting and non-inverting inputs of Gain Boost AMP_P. The output of the boost amplifier is coupled to the gate of the input cascode device P4. The gain boost amplifier senses the difference between the voltage levels at NODE1P and NODE2P and controls the gate voltage of the input cascode device P4 so that the drain voltage of the input transconductance device P1 will be substantially equal to the drain voltage of the output transconductance device P2.

As output node V_OUT swings from +1.25 to −1.25V, the voltages on NODE2P and NODE2N will remain relatively constant except for the highest and lowest portions, approximately the top and bottom 0.5V portions, of the output swing. During the top portion of the swing, the P cascode device P3 will drop out of saturation, and during the bottom portion of the swing, the N cascode device N3R will drop out of saturation. In both cases, the gain boost amplifiers will operate to maintain the transconductance input and output devices drain voltages approximately equal. Mirror operation will remain linear and provide high output resistance.

Cascode output devices in prior art current mirrors cannot drop several hundred millivolts out of saturation without substantially reducing the drain voltage of the output transconductance device, thereby substantially decreasing the linearity of the mirror transfer function and reducing its output resistance. These effects can only be overcome in prior art cascoded mirrors by increasing the quiescent drain-source voltage of the cascode devices to keep them in saturation. Such voltage increases also increase the stress on the device. The cascode device of the present invention can be operated at significantly lower voltage stress for the same output swing.

Figure 10:
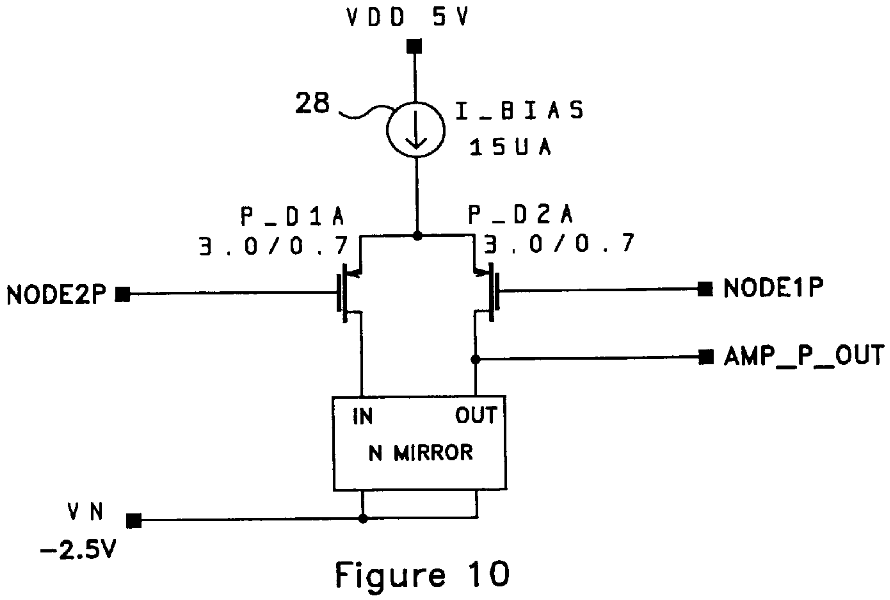
FIG. 10 is a simplified circuit diagram of a gain boost amplifier used in a PMOS current mirror of the present invention.

FIG. 10 is a simplified circuit diagram the Gain Boost AMP_P of the FIG. 9 current mirror 34. The amplifier input terminals (NODE1P and NODE2P of FIG. 9) are respectively connected to the gates of differential pair P channel transistors P_D1A and P_D2A. The sources of the differential pair transistors are coupled together and to a current bias generator 28. The drains of the differential pair transistors are respectively coupled to the input and output of a current mirror formed from N channel transistors. The current mirror is coupled to supply voltage VN, which is illustratively −2.5V. The amplifier output, AMP_P_OUT, is taken at the output of the current mirror.

Figure 11:
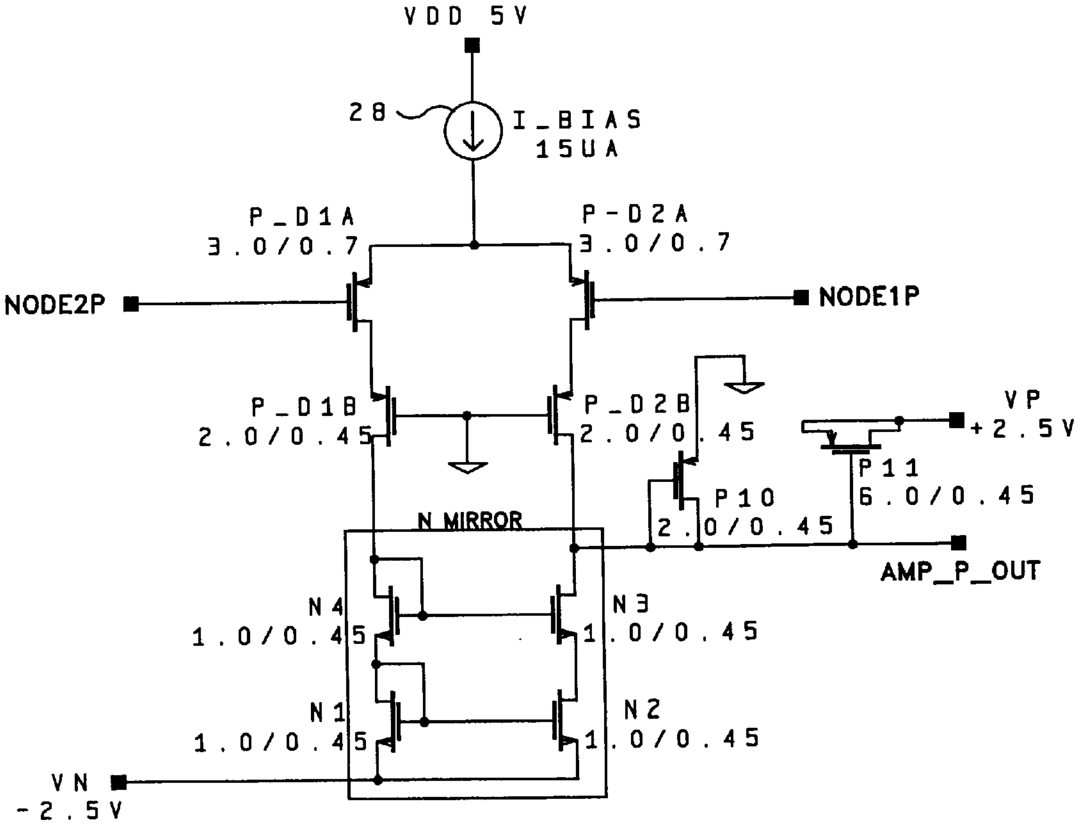
FIG. 11 is a circuit diagram of a gain boost amplifier used in a PMOS current mirror of the present invention.

FIG. 11 is a circuit diagram of the gain boost amplifier AMP_P. FIG. 11 shows P channel transistors P_D1B and P_D2B, the sources of which are respectively coupled to the drains of differential pair transistors P_D1A and P_D2A in a cascode arrangement. The gates of transistors P_D1B and P_D2B are coupled to ground. The drain of transistor P_D1B is coupled to the input of the N current mirror, and the drain of transistor P_D2B is coupled to the output of the N current mirror to provide the amplifier output AMP_P_OUT. The N current mirror is configured from input and output transconductance and cascode devices N1–N4 which correspond to the same four transistors as shown in and described with respect to prior art FIG. 2. The gain boost amplifier includes a clamping transistor P10 and a transistor P11 which is wired as a capacitor. Transistors P10 and P11 perform the same functions as explained above for transistors N10 and N11 in the N gain boost amplifier of FIG. 8.

It will be understood by those in the art that both the N and P gain boost amplifiers may be implemented by circuitry other than that shown in FIGS. 8 and 11. Different configurations can be used to realize the current mirrors, and variations on the basic amplifier structure are also acceptable.

Furthermore, while the invention has been described based on the use of MOSFET technology, other types of field effect transistors, or other similar active devices, are included within the scope of the invention, which is defined by the following claims.

What is claimed is:

1. A current mirror comprising:

first, second, third and fourth transistors, each having drain, source and gate terminals, the drain terminal of the first transistor being coupled to the source terminal of the fourth transistor to define a first node, the drain terminal of the second transistor being coupled to the source terminal of the third transistor to define a second node, and the gate terminal of the third transistor being coupled to a reference potential; and an amplifier having first and second inputs and an output, the first input of the amplifier being coupled to the first node, the second input of the amplifier being coupled to the second node, and the output of the amplifier being coupled to the gate terminal of the fourth transistor.

2. The current mirror of claim 1 wherein the reference potential is ground.

3. The current mirror of claim 1 wherein the source terminals of the first and second transistors are coupled to a first supply voltage, the drain terminal of the fourth transistor is coupled to an input terminal, and the drain terminal of the third transistor is coupled to an output terminal.

4. The current mirror of claim 3 wherein the gate terminals of the first and second transistors are coupled together to define a third node.

5. The current mirror of claim 4 wherein the third node is operatively coupled to the input terminal.

6. The current mirror of claim 5 wherein the third node is operatively coupled to the input terminal by at least one active device comprising a fifth transistor having a gate terminal coupled to the input terminal and a source terminal coupled to the third node.

7. The current mirror of claim 6 wherein the fifth transistor has a drain terminal which is coupled to a reference potential.

8. The current mirror of claim 7 wherein the reference potential is ground.

9. The current mirror of claim 5 wherein the third node is operatively coupled to the input terminal by a pair of transistors having source-drain paths coupled in series with each other between the third node and a reference potential, the pair of transistors having respective gate terminals each of which is coupled to the input terminal.

10. The current mirror of claim 9 wherein the reference potential is ground.

11. The current mirror of claim 4 wherein the third node is coupled to the first supply voltage via a current bias generator.

12. The current mirror of claim 11 wherein the current bias generator includes a first bias transistor having source and drain terminals, the drain terminal being coupled to the third node and the source terminal being coupled to the first supply voltage.

13. The current mirror of claim 12 wherein the first bias transistor has a gate terminal which is coupled to gate and drain terminals of a second bias transistor, the gate and drain terminals of the second bias transistor being coupled to a second current bias generator which is coupled to a second supply voltage.

14. The current mirror of claim 1 wherein the amplifier includes a differential pair of transistors and at least one sub-current mirror.

15. The current mirror of claim 14 wherein a drain terminal of one of the transistors in the differential pair of transistors is coupled to an input of the at least one sub-current mirror and a drain terminal of the other transistor in the differential pair of transistors is coupled to an output of the at least one sub-current mirror.

16. The current mirror of claim 14 wherein the at least one sub-current mirror comprises first, second and third sub-current mirrors, inputs to the first and second sub-current mirrors are coupled respectively to drain terminals of the differential pair transistors, and outputs of the first and second sub-current mirrors are respectively coupled to an input and an output of the third sub-current mirror.

17. In a current mirror having input transconductance, output transconductance, input cascode and output cascode transistors, each transistor having drain, source and gate terminals, the drain terminal of the input transconductance transistor being coupled to the source terminal of the input cascode transistor to define a first node and the drain terminal of the output transconductance transistor being coupled to the source terminal of the output cascode transistor to define a second node, a method for providing the current mirror with wide linear dynamic range, the method comprising:

sensing a voltage on the first node;

sensing a voltage on the second node;

comparing the voltages on the first and second nodes to generate a control signal;

using the control signal to vary the voltage on the first node; and coupling the gate terminal of the output cascode transistor to a reference potential.

18. The method of claim 17 wherein the using the control signal step comprises coupling the control signal to the gate terminal of the input cascode transistor.

19. The method of claim 18 wherein coupling the control signal to the gate terminal of the input cascode transistor controls the voltage on the first node to be substantially equal to the voltage on the second node.

20. The method of claim 17 wherein the reference potential is ground.

21. A current mirror comprising:

an input transconductance transistor;

an output transconductance transistor, gate terminals of the input and output transconductance transistors being coupled together and operatively coupled to an input of the current mirror; and means for maintaining a voltage on a drain terminal of the input transconductance transistor substantially equal to a voltage on a drain terminal of the output transconductance transistor, wherein a gate terminal of the output cascode device is coupled to a reference potential.

22. The current mirror of claim 21 wherein the means for maintaining comprises an operational amplifier.

23. The current mirror of claim 22 further including:

an input cascode transistor having a source terminal which is coupled to the drain terminal of the input transconductance transistor; and an output cascode transistor having a source terminal which is coupled to the drain terminal of the output transconductance transistor, wherein a first input of the operational amplifier is coupled to the drain terminal of the input transconductance transistor, a second input of the operational amplifier is coupled to the drain terminal of the output transconductance transistor and an output of the operational amplifier is coupled to a gate terminal of the input cascode transistor.

24. The current mirror of claim 21 wherein the reference potential is ground.

25. A current mirror comprising:

an input transconductance transistor having a drain terminal;

an input cascode transistor coupled to the input transconductance transistor;

an output transconductance transistor having a drain terminal;

an output cascode transistor coupled to the output transconductance transistor; and means for maintaining a voltage on the drain terminal of the input transconductance transistor substantially equal to a voltage on the drain terminal of the output transconductance transistor, wherein a gate terminal of the output cascode transistor is coupled to a reference potential.

26. The current mirror of claim 25 wherein:

the input transconductance transistor is coupled to an input of the current mirror via a source-drain path of the input cascode transistor, and the output transconductance transistor is coupled to an output of the current mirror via a source-drain path of the output cascode transistor.

27. The current mirror of claim 26 wherein gate terminals of the input and output transconductance transistors are coupled together and operatively coupled to the input of the current mirror.

28. The current mirror of claim 27 wherein the gate terminals of the input and output transconductance transistors are operatively coupled to the input of the current mirror via at least one active device.

29. The current mirror of claim 26 wherein source terminals of the input and output transconductance transistors are coupled together and to a supply potential.

30. The current mirror of claim 25 wherein the reference potential is ground.

31. An amplifier comprising:

an input transistor coupled to an input of the amplifier; and a current mirror including:

an input transconductance transistor operatively coupled to the input transistor, the input transconductance transistor having a drain terminal, an output transconductance transistor operatively coupled to an output of the amplifier, the output transconductance transistor having a drain terminal, and means for maintaining a voltage on the drain terminal of the input transconductance transistor substantially equal to a voltage on the drain terminal of the output transconductance transistor, wherein a gate terminal of the output cascode transistor is coupled to a reference potential.

32. The amplifier of claim 31 wherein:

the input transconductance transistor is operatively coupled to the input transistor via a source-drain path of an input cascode transistor, the output transconductance transistor is operatively coupled to the output of the amplifier via a source-drain path of an output cascode transistor, and the means for maintaining a voltage comprises a sub-amplifier having first and second inputs and an output, the first, input of the sub-amplifier being coupled to the drain terminal of the input transconductance transistor, the second input of the sub-amplifier being coupled to the drain terminal of the output transconductance transistor, and the output of the sub-amplifier being coupled to a gate terminal of the input cascode transistor.

33. The amplifier of claim 32 wherein gate terminals of the input and output transconductance transistors are coupled together and operatively coupled to the input transistor via at least one active device.

34. The amplifier of claim 32 wherein source terminals of the input and output transconductance transistors are coupled together and to a supply potential.

35. The amplifier of claim 31 wherein the reference potential is ground.

36. An amplifier comprising:

a pair of input transistors, each having a gate terminal which is coupled to a respective input to the amplifier;

first and second current mirrors, each of which includes first, second, third and fourth transistors, each transistor having drain, source and gate terminals, in each of the current mirrors, the drain terminal of the fourth transistor being operatively coupled to a corresponding one of the input transistors, the drain terminal of the first transistor being coupled to the source terminal of the fourth transistor to define a first node, and the drain terminal of the second transistor being coupled to the source terminal of the third transistor to define a second node; and a sub-amplifier having first and second inputs and an output, the first input of the sub-amplifier being coupled to the first node in the first current mirror, the second input of the sub-amplifier being coupled to the second node in the first current mirror, and the output of the sub-amplifier being coupled to the gate terminal of the fourth transistor in the first current mirror.

37. An amplifier comprising:

a pair of input transistors, each having a gate terminal which is coupled to a respective input to the amplifier;

first and second current mirrors, each of which includes first, second, third and fourth transistors, each transistor having drain, source and gate terminals, in each of the current mirrors, the drain terminal of the fourth transistor being operatively coupled to a corresponding one of the input transistors, the drain terminal of the first transistor being coupled to the source terminal of the fourth transistor to define a first node, and the drain terminal of the second transistor being coupled to the source terminal of the third transistor to define a second node; and a sub-amplifier having first and second inputs and an output, the first input of the sub-amplifier being coupled to the first node in the first current mirror, the second input of the sub-amplifier being coupled to the second node in the first current mirror, and the output of the sub-amplifier being coupled to the gate terminal of the fourth transistor in the first current mirror, wherein the output of the sub-amplifier is further coupled to the gate terminals of the third and fourth transistors in the second current mirror.

38. An amplifier comprising:

a pair of input transistors, each having a gate terminal which is coupled to a respective input to the amplifier;

first and second current mirrors, each of which includes first, second, third and fourth transistors, each transistor having drain, source and gate terminals, in each of the current mirrors, the drain terminal of the fourth transistor being operatively coupled to a corresponding one of the input transistors, the drain terminal of the first transistor being coupled to the source terminal of the fourth transistor to define a first node, and the drain terminal of the second transistor being coupled to the source terminal of the third transistor to define a second node; and a sub-amplifier having first and second inputs and an output, the first input of the sub-amplifier being coupled to the first node in the first current mirror, the second input of the sub-amplifier being coupled to the second node in the first current mirror, and the output of the sub-amplifier being coupled to the gate terminal of the fourth transistor in the first current mirror, wherein the gate terminal of the third transistor in the first current mirror is coupled to a reference potential.

39. An amplifier comprising:

a pair of input transistors, each having a gate terminal which is coupled to a respective input to the amplifier;

first and second current mirrors, each of which includes first, second, third and fourth transistors, each transistor having drain, source and gate terminals, in each of the current mirrors, the drain terminal of the fourth transistor being operatively coupled to a corresponding one of the input transistors, the drain terminal of the first transistor being coupled to the source terminal of the fourth transistor to define a first node, and the drain terminal of the second transistor being coupled to the source terminal of the third transistor to define a second node; and a sub-amplifier having first and second inputs and an output, the first input of the sub-amplifier being coupled to the first node in the first current mirror, the second input of the sub-amplifier being coupled to the second node in the first current mirror, and the output of the sub-amplifier being coupled to the gate terminal of the fourth transistor in the first current mirror, wherein in each of the current mirrors, the gate terminal of the first transistor is coupled to the gate terminal of the second transistor to define a third node, the third node in the first current mirror being coupled to one of the input transistors via a first active device, and the third node in the second current mirror being coupled to the other input transistor via a second active device.

40. An amplifier comprising:

a pair of input transistors, each having a gate terminal which is coupled to a respective input to the amplifier;

first, second and third current mirrors, each of which includes first, second, third and fourth transistors, each transistor having drain, source and gate terminals, in the first and second current mirrors, the drain terminal of the fourth transistor being operatively coupled to respective drain terminals of the input transistors, in each of the current mirrors, the drain terminal of the first transistor being coupled to the source terminal of the fourth transistor to define a first node, and the drain terminal of the second transistor being coupled to the source terminal of the third transistor to define a second node; and first and second sub-amplifiers, each sub-amplifier having first and second inputs and an output, the first input of the first sub-amplifier being coupled to the first node in the first current mirror, the second input of the first sub-amplifier being coupled to the second node in the first current mirror, and the output of the first sub-amplifier being coupled to the gate terminal of the fourth transistor in the first current mirror, and the first input of the second sub-amplifier being coupled to the first node in the third current mirror, the second input of the second sub-amplifier being coupled to the second node in the third current mirror, and the output of the second sub-amplifier being coupled to the gate terminal of the fourth transistor in the third current mirror.

41. The amplifier of claim 40 wherein the output of the first sub-amplifier is coupled to the gate terminal of the fourth transistor in the second current mirror.

42. The amplifier of claim 41 wherein the output of the first sub-amplifier is coupled to the gate terminal of the third transistor in the second current mirror.

43. The amplifier of claim 40 wherein the drain terminal of the third transistor in the first current mirror is coupled to the drain terminal of the third transistor in the third current mirror and the drain terminal of the third transistor in the second current mirror is coupled to the drain terminal of the fourth transistor in the third current mirror.

* * * * *